(12) United States Patent
Mouli et al.

(10) Patent No.: US 6,888,214 B2
(45) Date of Patent: May 3, 2005

(54) ISOLATION TECHNIQUES FOR REDUCING DARK CURRENT IN CMOS IMAGE SENSORS

(75) Inventors: Chandra Mouli, Boise, ID (US); Howard Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 10/291,772

(22) Filed: Nov. 12, 2002

(65) Prior Publication Data

US 2004/0089914 A1 May 13, 2004

(51) Int. Cl.[7] .................. H01L 29/00; H01L 23/043
(52) U.S. Cl. ................. 257/510; 257/513; 257/524; 257/508; 257/760; 257/222; 257/225; 257/223; 257/330
(58) Field of Search ............... 257/510, 513, 257/508, 524, 760, 330, 222, 223, 225

(56) References Cited

U.S. PATENT DOCUMENTS

| | | | |
|---|---|---|---|
| 6,118,142 A | * | 9/2000 | Chen et al. .................. 257/232 |
| 6,177,333 B1 | | 1/2001 | Rhodes |
| 6,204,524 B1 | | 3/2001 | Rhodes |
| 6,232,626 B1 | * | 5/2001 | Rhodes ........................ 257/292 |
| 6,501,149 B2 | * | 12/2002 | Hong .......................... 257/510 |
| 6,545,302 B2 | * | 4/2003 | Han ............................ 257/222 |
| 6,548,861 B2 | * | 4/2003 | Palm et al. ................. 257/330 |
| 6,555,891 B1 | * | 4/2003 | Furukawa et al. .......... 257/505 |

OTHER PUBLICATIONS

R. H. Nixon, et al.—"256 × 256 CMOS Active Pixel Sensor Camer-on-a-Chip," IEEE Journal of Solid State Circuits, vol. 31, No. 12, Dec. 1996, pp. 2046–2050.

Sunetra Mendis, et al.—" CMOS Active Pixel Image Sensor," IEEE Transactions on Electron Devices, vol. 41, No. 3, Mar. 1994, pp. 452–453.

* cited by examiner

Primary Examiner—Allan R. Wilson
Assistant Examiner—Joseph Nguyen
(74) Attorney, Agent, or Firm—Dickstein Shapiro Morin & Oshinsky LLP

(57) ABSTRACT

Isolation methods and devices for isolating regions of a semiconductor device. The isolation method and structure include forming an isolating trench in an active area and filling the trench with a doped conductive material containing silicon. Suitable conductive materials containing silicon include polysilicon and silicon-germanium. There is also provided a method and structure for isolating the regions by providing a trench in an active area of a substrate, growing an epitaxial layer in the trench to fill the trench or to partially fill the trench and depositing an insulating material over the epitaxial layer and within the trench to completely fill the trench.

42 Claims, 12 Drawing Sheets

ISOLATION TECHNIQUES FOR REDUCING DARK CURRENT IN CMOS IMAGE SENSORS

FIELD OF THE INVENTION

The present invention relates generally to semiconductor devices, and more particularly, to trench isolation technology for use in semiconductor devices, including CMOS image sensors.

BACKGROUND OF THE INVENTION

In silicon integrated circuit (IC) fabrication, it is often necessary to isolate semiconductor devices formed in the substrate. This is true for many semiconductor memory devices, for example, DRAM, flash memory, SRAM, microprocessors, DSP and ASIC. The individual pixels of a CMOS image sensor also need to be isolated from each other.

A CMOS image sensor circuit includes a focal plane array of pixel cells, each one of the cells including a photogate, photoconductor, or photodiode overlying a charge accumulation region within a substrate for accumulating photo-generated charge. Each pixel cell may include a transistor for transferring charge from the charge accumulation region to a floating diffusion node and a transistor, for resetting the diffusion node to a predetermined charge level prior to charge transference. The pixel cell may also include a source follower transistor for receiving and amplifying charge from the diffusion node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge from the floating diffusion node. Photo charge may be amplified when it moves from the initial charge accumulation region to the floating diffusion node. The charge at the floating diffusion node is typically converted to a pixel output voltage by a source follower output transistor. The photosensitive element of a CMOS image sensor pixel is typically either a depleted p-n junction photodiode or a field induced depletion region beneath a photogate. A photon impinging on a particular pixel of a photosensitive device may diffuse to an adjacent pixel, resulting in detection of the photon by the wrong pixel, i.e. cross-talk. Therefore, CMOS image sensor pixels must be isolated from one another to avoid pixel cross talk. In the case of CMOS image sensors, which are intentionally fabricated to be sensitive to light, it is advantageous to provide both electrical and optical isolation between pixels.

CMOS image sensors of the type discussed above are generally known as discussed, for example, in Nixon et al., "256.times.256 CMOS Active Pixel Sensor Camera-on-a-Chip," IEEE Journal of Solid-State Circuits, Vol. 31(12), pp. 2046–2050 (1996); and Mendis et al., "CMOS Active Pixel Image Sensors," IEEE Transactions on Electron Devices, Vol. 41(3), pp. 452–453 (1994). See also U.S. Pat. Nos. 6,177,333 and 6,204,524, which describe operation of conventional CMOS image sensors, the contents of which are incorporated herein by reference.

Shallow trench isolation (STI) is one technique, which can be used to isolate pixels, devices or circuitry from one another. In general, a trench is etched into the substrate and filled with a dielectric to provide a physical and electrical barrier between adjacent pixels, devices, or circuitry. Refilled trench structures, for example, are formed by etching a trench by a dry anisotropic or other etching process and then filling it with a dielectric such as a chemical vapor deposited (CVD) silicon dioxide ($SiO_2$). The filled trench is then planarized by an etch-back process so that the dielectric remains only in the trench and its top surface remains level with that of the silicon substrate. The depth of a shallow trench is generally from about 2000 to about 2500 Angstroms.

One drawback associated with shallow trench isolation in the case of CMOS image sensors is cross-talk from a photon impinging on a particular pixel of a photosensitive device causing changes that may diffuse under the shallow trench isolation structure to an adjacent pixel. Another drawback is that a hole accumulation layer along the sidewall of the trench is relatively small since it is limited by the depth of the shallow trenches.

One technique which may be used to improve pixel isolation in CMOS image sensors is to implant dopants beneath the isolation region; however, it has been found that this may contribute undesirably to pixel dark current. Minimizing dark current in the photodiode is a key device optimization step in CMOS image sensor fabrication.

It is desirable to provide an isolation technique that prevents cross-talk between pixels while reducing dark current or current leakage as much as possible. It is also desirable to provide an isolation technique while increasing a hole accumulation region adjacent a pixel isolation region.

BRIEF SUMMARY OF THE INVENTION

In one aspect, the invention provides a structure for isolating areas in a semiconductor device having a trench filled with a conductive material containing silicon formed in an active layer of a substrate to isolate adjacent regions. The conductive material containing silicon may be doped with n-type or p-type dopants prior to or after deposition of the material. Preferred conductive materials containing silicon include polysilicon and silicon-germanium. In another aspect, the invention provides forming a trench adjacent an active layer of a substrate, growing an epitaxial layer to partially fill the trench and depositing an insulating material over the epitaxial layer and within the trench to completely fill the trench.

These and other features and advantages of the invention will be more apparent from the following detailed description that is provided in connection with the accompanying drawings and illustrate exemplary embodiments of the invention.

DETAILED DESCRIPTION OF THE INVENTION

In the following detailed description, reference is made to the accompanying drawings, which form a part hereof, and in which is shown by way, of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an image sensor will proceed simultaneously in a similar fashion.

Applicants propose several trench isolation techniques to isolate areas of semiconductor devices and in an exemplary embodiment to minimize dark current and suppress leakage current in CMOS image sensors, as described below with reference to FIGS. 2–15. To better illustrate these techniques, a brief description of an exemplary CMOS image sensor pixel is described first with reference to FIGS. 1A and 1B hereinbelow. However, it should be noted that the invention is not limited to CMOS image sensors and may be used in any suitable device, for example, a DRAM, flash memory, SRAM, microprocessor, DSP or ASIC.

Figure 1A:
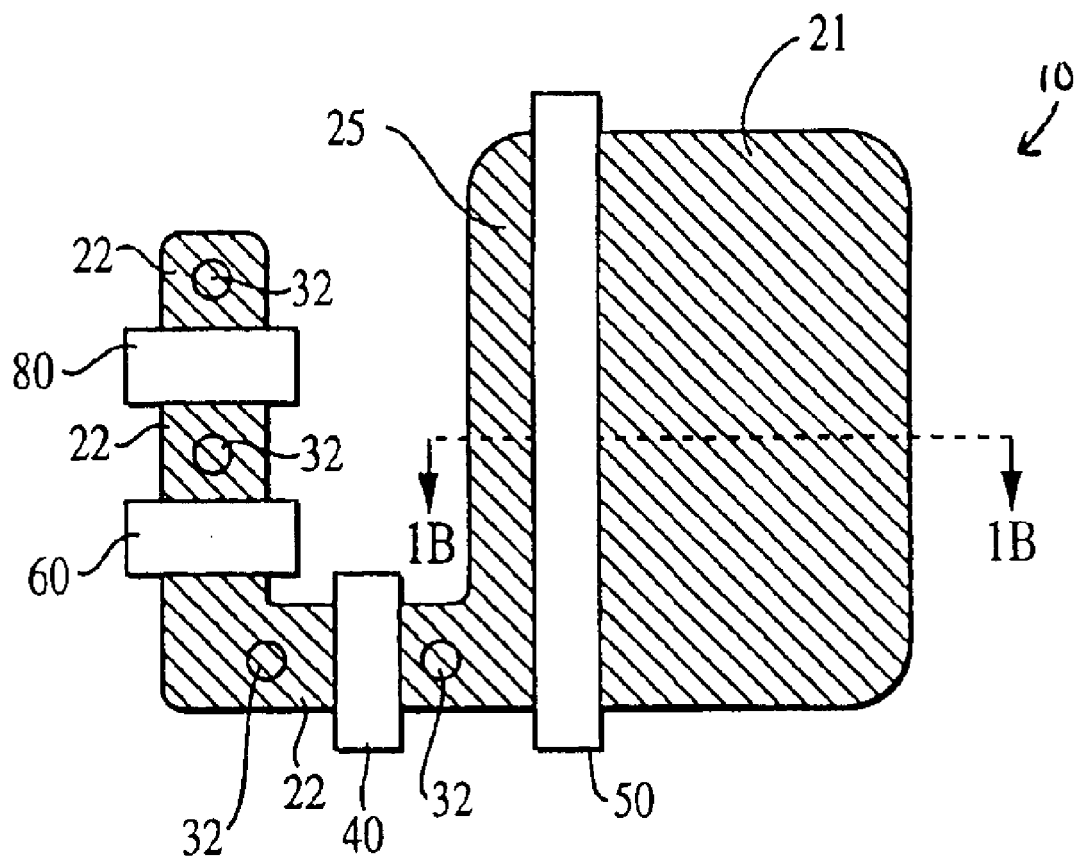
FIG. 1A is a top plan view of an exemplary CMOS image sensor fragment.
Figure 1B:
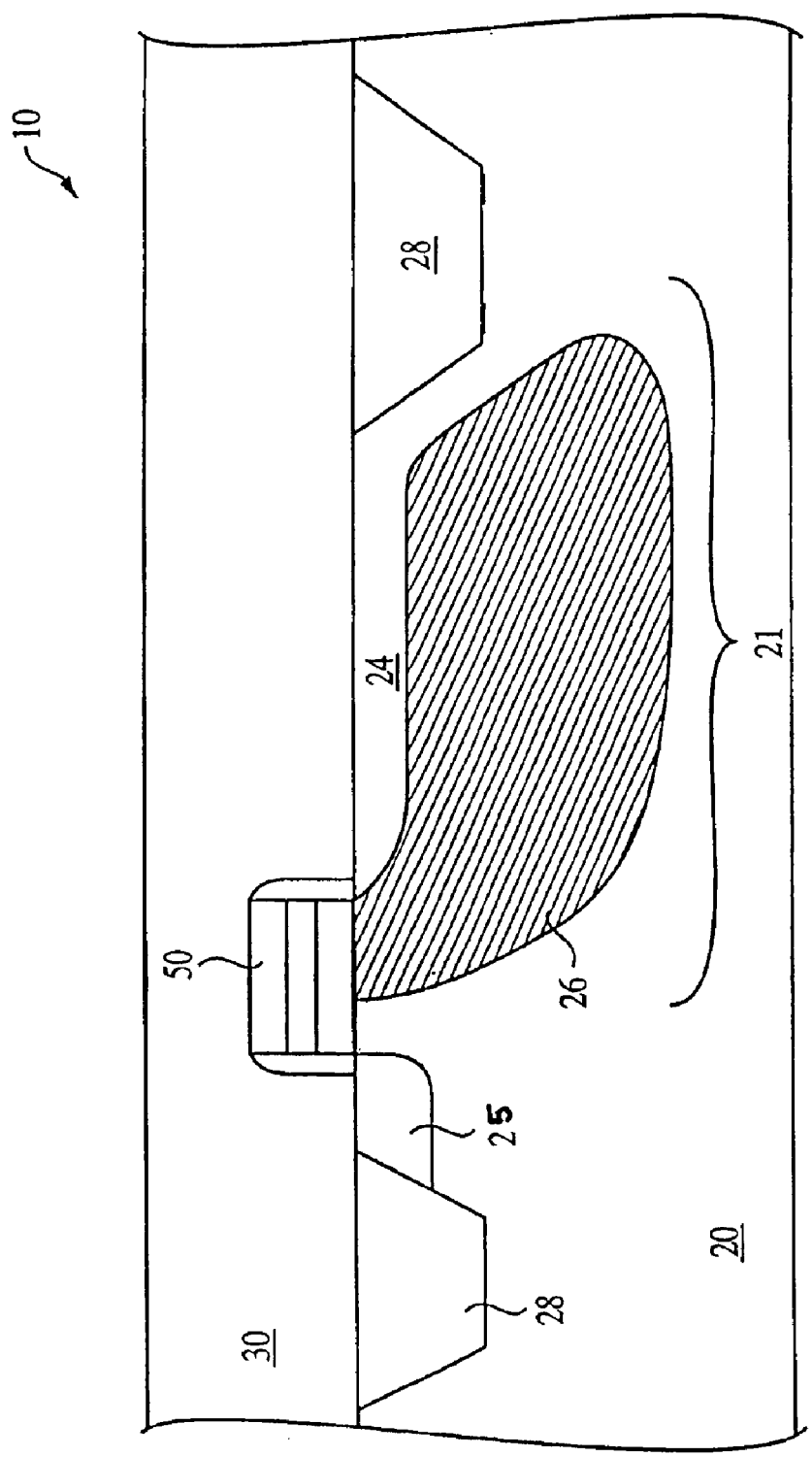
FIG. 1B is a diagrammatic side sectional view of the FIG. 1A image sensor fragment taken along line 1B—1B.

Referring now to FIGS. 1A and 1B, a semiconductor wafer fragment of an exemplary CMOS image sensor four-transistor (4T) pixel, generally designated by reference numeral 10, is shown. It should be noted that while FIGS. 1A–1B show the use of a transfer gate 50 and associated transistor, the transfer gate 50 provides advantages, but is not required. Thus, the invention may be used in any CMOS imager including, for example, a three transistor (3T) environment where the transfer gate is omitted and an n-type charge collection region of a photodiode is connected with an n-type diffusion region 21. The CMOS image sensor 10 generally comprises a charge collection region 21 for collecting charges generated by light incident on the pixel and transfer gate 50 for transferring photoelectric charges from the collection region 21 to a sensing node, typically a floating diffusion region 25. The floating diffusion region is electrically connected to the gate of an output source follower transistor. The pixel also includes a reset transistor 40 for resetting the sensing node to a predetermined voltage before sensing a signal, a source follower transistor 60 which receives at its gate an electrical signal from the sensing node 25, and a row select transistor 80 for outputting a signal from the source follower transistor 60 to an output terminal in response to an address signal.

The exemplary CMOS image sensor uses a pinned photodiode as the charge collection region 21. The pinned photodiode is termed such since the potential in the photodiode is pinned to a constant value when the photodiode is fully depleted. The pinned photodiode has a photosensitive or p-n-p junction region comprising a p-type surface layer 24 and an n-type photodiode region 26 within a p-type active layer 20. The pinned photodiode includes two p-type regions 20, 24 so that the n-type photodiode region is fully depleted at a pinning voltage. Impurity doped source/drain regions 22, preferably having n-type conductivity, are provided about the transistor gates 40, 60, 80. The floating diffusion region 25 adjacent to transfer gate 50 is also preferable n-type.

In a typical CMOS image sensor, trench isolation regions 28 formed in the active layer 20 are used to isolate the pixels. FIGS. 1A and 1B illustrate typical STI isolation trenches 28. The trench isolation regions 28 are formed using a typical STI process and are generally formed by etching a trench in the doped active layer or substrate 20 via a directional etching process, such as Reactive Ion Etching (RIE), or etching with a preferential anisotropic etchant used to etch into the doped active layer 20 to a sufficient depth, generally about 1000 to 3000 Angstroms.

The trenches are then filled with an insulating material, for example, silicon dioxide, silicon nitride, ON (oxide-nitride), NO (nitride-oxide), or ONO (oxide-nitride-oxide).

The gate stacks for the pixel transistors are formed before or after the trench is etched. The order of these preliminary process steps may be varied as is required or convenient for a particular process flow, for example, if a known photogate sensor (not shown) which overlaps the transfer gate is desired, the gate stacks must be formed before the photogate, but if a non-overlapping photogate is desired, the gate stacks may be formed after photogate formation.

A translucent or transparent insulating layer 30 is formed over the CMOS image sensor. Conventional processing methods are then carried out to form, for example, contacts 32 (shown in FIG. 1A) in the insulating layer 30 to provide an electrical connection to the source/drain regions 22, the floating diffusion region 25, and other wiring to connect gate lines and other connections in the sensor 10. For example, the entire surface may then be covered with a passivation layer of e.g., silicon dioxide, BSG, PSG, or BPSG, which is planarized and etched to provide contact holes, which are then metallized to provide contacts to the photogate (if used), reset gate, and transfer gate.

In CMOS image sensors depicted in FIGS. 1A and 1B, electrons are generated by light incident externally and stored in the n-type photodiode region 26. These charges are transferred to the diffusion node 25 by the gate structure 50 of the transfer transistor. The source follower transistor produces an output signal from the transferred charges. A maximum output signal is proportional to the number of electrons extracted from the n-type photodiode region 26. The maximum output signal increases with increased electron capacitance or acceptability of the photodiode. The electron capacity of pinned photodiodes typically depends on doping levels and the dopants implanted to form regions 24, 26, 20.

A problem associated with the shallow trench isolation technique is photon diffusion under the shallow trench isolation structure from one pixel to an adjacent pixel. Attempts have been made to enhance isolation by implanting ions beneath the shallow trench isolation structure. However, these implants result in high current leakage. The invention provides a novel technique for improved isolation between adjacent pixels that does not require additional implants beneath the trench, thereby minimizing the generation of dark current in the CMOS image sensor.

Another consideration in CMOS image sensor fabrication are isolation design rules are constructed to make sure that there is enough margin to prevent punch-through in CMOS circuits. For example, the trench 28 separates the source/drain regions 22 of one pixel from the active layer of an adjacent pixel. Accordingly shallow trenches are generally sufficiently wide to allow a margin adequate enough to prevent punch-through or current leakage. The invention further provides novel techniques for preventing current leakage while allowing tighter design rules in CMOS circuits.

A first embodiment according to the invention is now described with reference to FIGS. 2–6. Applicant proposes an STI process, which uses an isolation trench filled with a doped conductive material containing silicon. Shallow trench isolation regions for CMOS image sensors generally have a depth of less than about 3000 Angstroms and generally around about 2000 to about 2500 Angstroms. Typically, shallow trench regions are filled with a conventional insulator, such as oxides or high density plasma (HDP) oxides. However, it is difficult to fill trenches having a depth greater than 2500 Angstroms with conventional insulators due to the limited spacing within the trench, for example, undesirable voids or air gaps are formed when oxides are used to fill trenches having a depth greater than about 2500 Angstroms. In accordance with the first embodiment of the invention, Applicants propose filling trenches with conductive materials containing silicon, preferably polysilicon or silicon-germanium. Conductive materials containing silicon may be easily deposited into trenches of various depths, unlike conventional insulation materials, e.g., silicon dioxide, silicon nitride, NO, ON, HDP, and ONO, which are difficult to fill in deep trenches. Thus, using a conductive material containing silicon to fill the trench 328 will allow easy formation of a trench, particularly, a deep trench having a depth greater than about 2000 Angstroms, and preferably about 4000 to about 5000 Angstroms.

Generally, the deeper the trench the better the isolation. With respect to CMOS image sensors in particular, the deeper the trench the higher the electron storage capacitance of the CMOS image sensor. A trench according to the invention is deeper than a shallow trench, and accordingly has longer sidewalls than a shallow trench. Therefore, the longer sidewalls allow for a larger electrical connection region 323 along the sidewalls of the trench such that electron storage capacitance, e.g., hole accumulation, in the electrical connection region 323 is increased in accordance with the invention.

Figure 2:
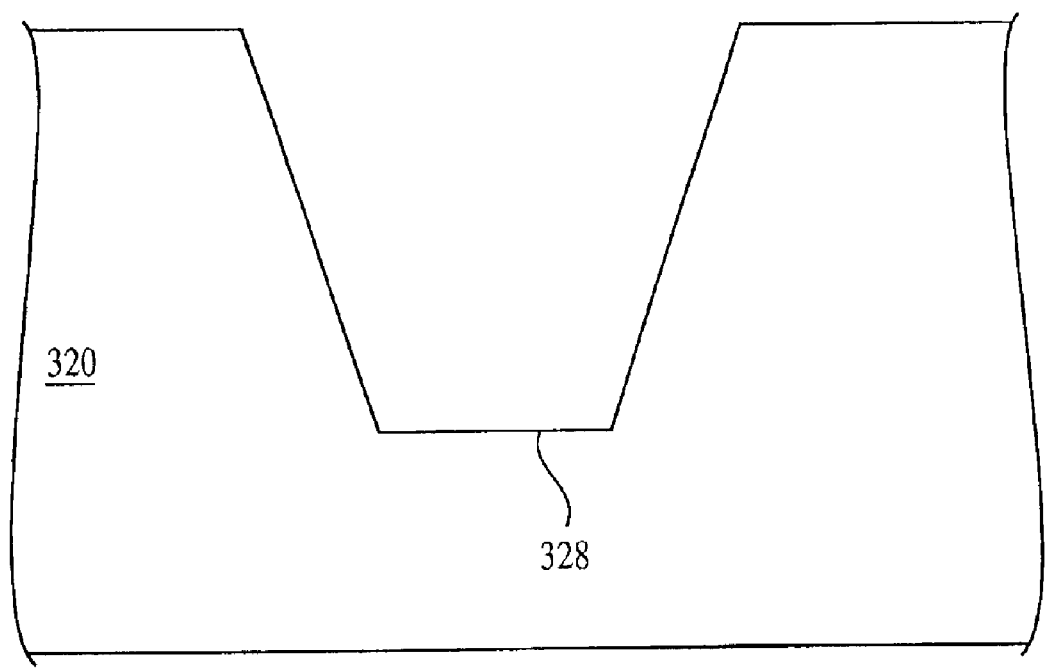
FIG. 2 is a diagrammatic side sectional view of a CMOS image sensor fragment showing a trench in process in accordance with a third embodiment of the present invention.

In a CMOS image sensor having a trench filled with a conductive material containing silicon in accordance with the present invention, as shown in FIG. 2, a trench 328 is etched into a doped active layer 320. A resist and mask are applied, and photolithographic techniques are used to define the area to be etched-out. A directional etching process, such as Reactive Ion Etching (RIE), or etching with a preferential anisotropic etchant is used to etch into the doped active layer 320 to form the trench 328. The resist and mask are removed leaving a structure that appears as shown in FIG. 2.

Figure 3:
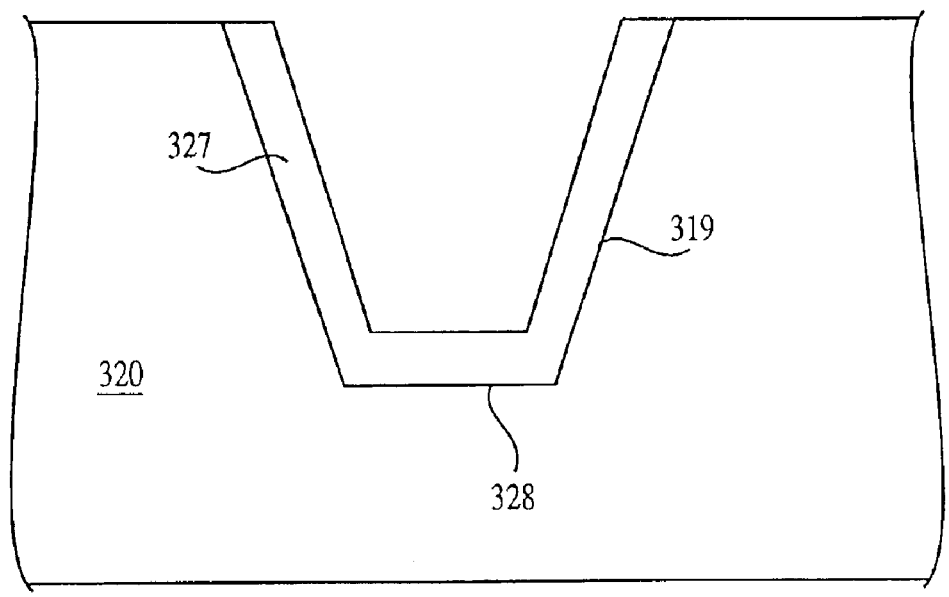
FIG. 3 is a diagrammatic side sectional view of a CMOS image sensor fragment showing a trench at a processing step subsequent to that shown in FIG. 2.

Referring now to FIG. 3, an oxide, i.e., $SiO_2$ or other dielectric liner 327 is grown within the trench 328. The oxide liner may be formed of NO, ON, or ONO among many other suitable materials. The dielectric liner 327 may be substantially conformal. In other words, the thickness of the liner 327 is substantially the same along the sidewalls 319 and at the bottom of the trench 328. In general, the thickness of the dielectric liner 327 along the sidewalls should be at least about 100 Angstroms.

Figure 4:
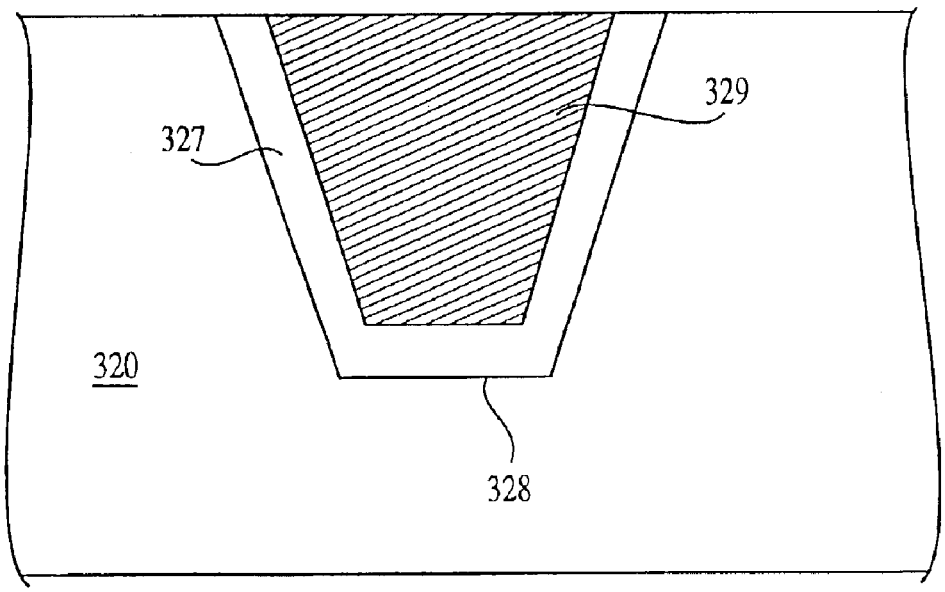
FIG. 4 is a diagrammatic side sectional view of a CMOS image sensor fragment showing a trench at a processing step subsequent to that shown in FIG. 3.
Figure 5:
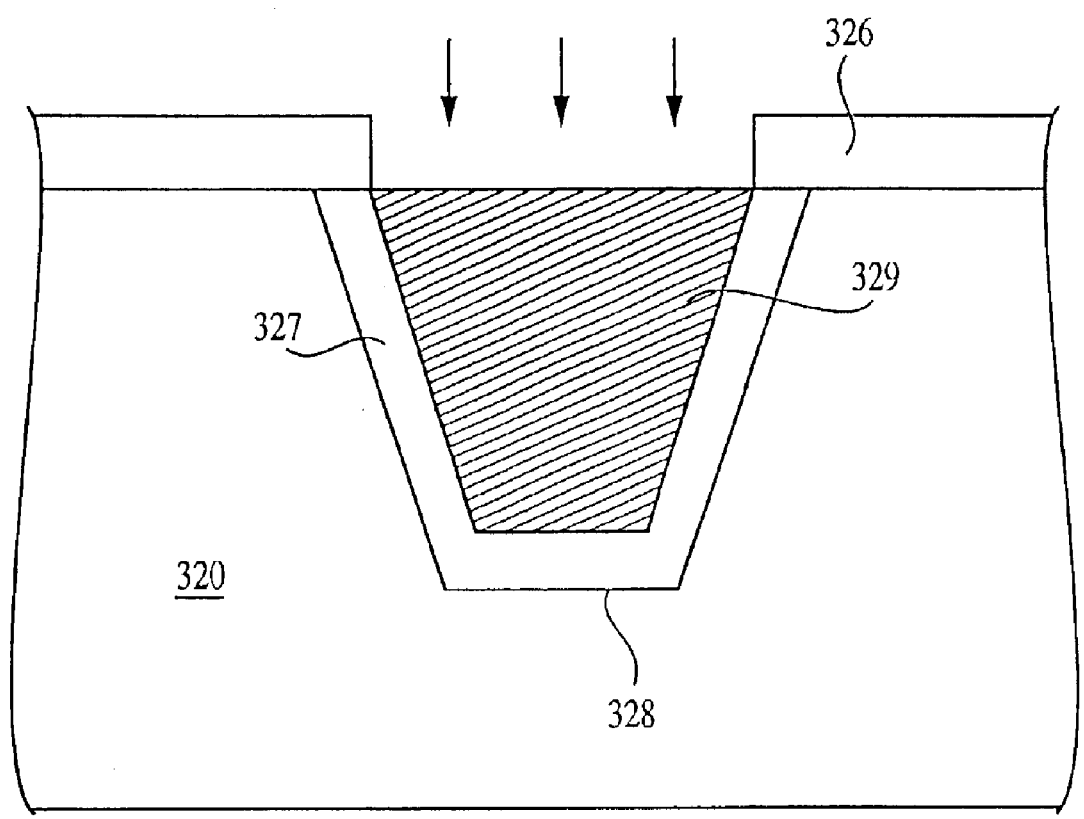
FIG. 5 is a diagrammatic side sectional view of a CMOS image sensor fragment showing a trench at a processing step subsequent to that shown in FIG. 3.

Referring now to FIG. 4, a highly doped (in-situ doped) n-type or p-type conductive material containing silicon 329 is deposited to fill the trench 328. Suitable conductive materials containing silicon include polysilicon and silicon-germanium. Alternatively, as shown in FIG. 5, the trench 328 may be filled with a conductive material containing silicon 329 then, a masked ion implant (indicated by arrows) may be performed to dope the conductive material containing silicon. For example, in the case of a p-type active layer 320, with p-type wells, p-type ions such as boron (B) can be implanted into the conductive material containing silicon using a photoresist mask 326. Similarly, in the case of an n-type active layer 320 with n-type wells, n-type ions such as phosphorous (P), arsenic (As), or antimony (Sb) can be implanted.

Conductive materials containing silicon are easily filled into deep trenches. The deeper the trench, the harder it is to fill the trench with conventional insulators. Oxides and other conventional insulators form voids or air gaps when used to fill deep trenches. However, in accordance with the invention, a trench may be filled with a conductive material containing silicon easily and effectively.

Figure 6:
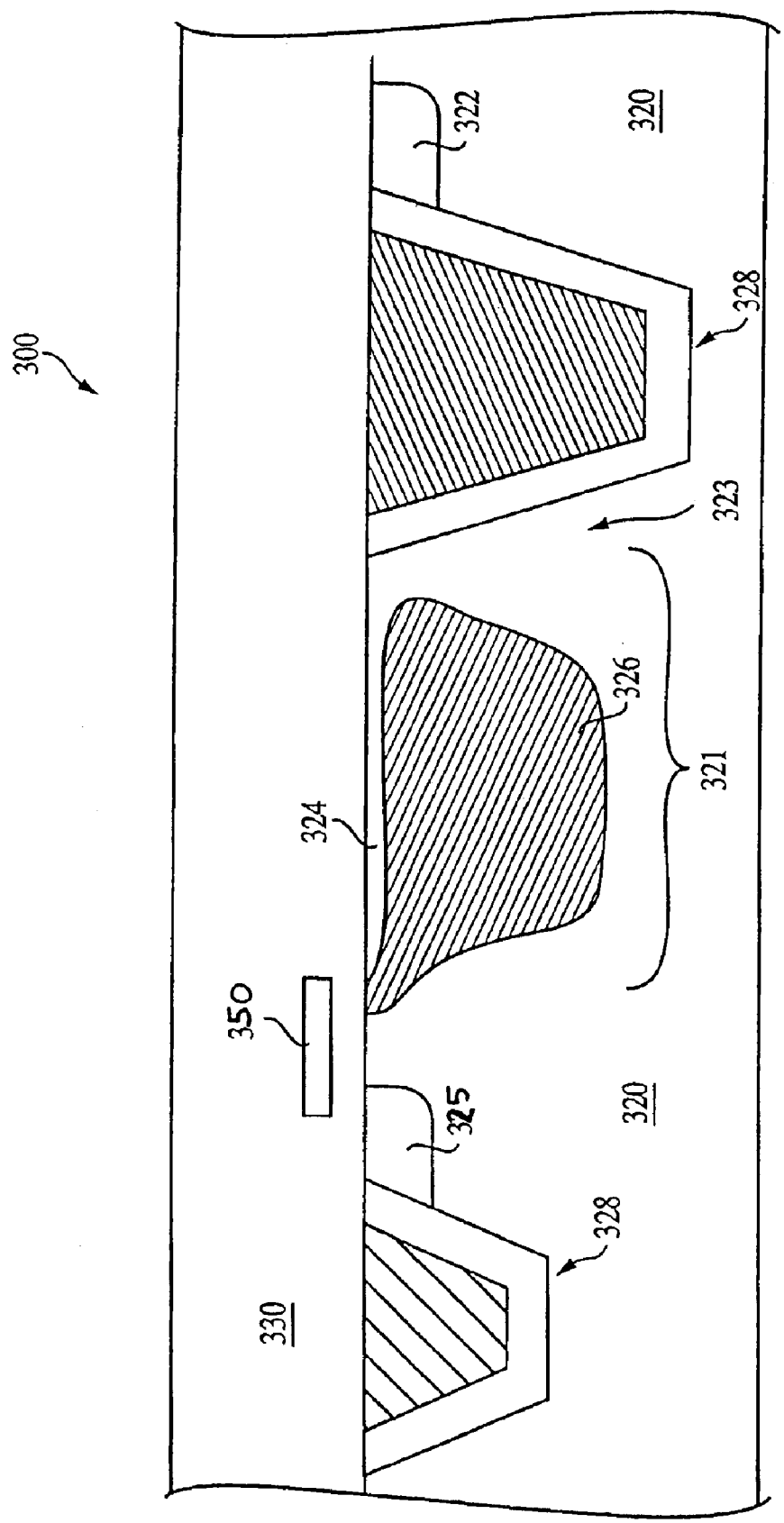
FIG. 6 is a diagrammatic side sectional view of a CMOS image sensor fragment incorporating the trench of FIGS. 4 and 5.

An exemplary CMOS image sensor in accordance with the invention and having a pinned photodiode 321 is shown in FIG. 6. The pinned photodiode 321 has a p-type surface layer 324 and an n-type photodiode region 326 within a p-type active layer 320. A junction is formed around the entirety of the n-type region 326. An impurity doped floating diffusion region 325, preferably having n-type conductivity, is provided on one side of the channel region of transfer gate 350, the other side of which has a portion of n-type region 326. A trench isolation region 328 is formed in the active layer 320 adjacent to but spaced from the n-type region 321. An electrical connection region 323 for providing hole accumulation is formed adjacent the sidewalls of the trench isolation region 328. The trench isolation region 328 is formed as described above with respect to FIGS. 2–5.

The gate stacks, for example the transfer gate 350, may be formed before or after the trench is etched. The order of these process steps may be varied as is required or convenient for a particular process flow, for example, if a photogate sensor which overlaps the transfer gate is desired, the gate stacks must be formed before the photogate, but if a non-overlapping photogate is desired, the gate stacks may be formed after photogate formation.

A translucent or transparent insulating layer 330 is formed over the CMOS image sensor 300. Conventional processing methods are then carried out to form for example, contacts (not shown) in the insulating layer 330 to provide an electrical connection to the source/drain regions 322, the floating diffusion region 325, and other wiring to connect gate lines and other connections in the sensor 300. For example, the entire surface may then be covered with a passivation layer, of e.g., silicon dioxide, BSG, PSG, or BPSG, which is CMP planarized and etched to provide contact holes, which are then metallized to provide contacts to the photogate (if used), reset gate, and transfer gate.

The use of a trench in accordance with the invention provides improved isolation between pixels. The deeper trench better inhibits electrons from diffusing under the isolation trench to an adjacent pixel thereby preventing cross-talk between neighboring pixels. Accordingly, by enhancing isolation via a deeper trench, additional implants under the trench are not necessary, therefore by reducing the implants needed for isolation, current leakage is also reduced. Another advantage of the invention, is that the use of a deep trench filled with a conductive material containing silicon in accordance with the invention provides a deeper hole accumulation region, thereby increasing electron storage capacity. Also the deeper trench allows for tighter isolation design rules. Deeper trenches may also be narrower than shallow trenches, while still providing effective isolation between neighboring regions. Accordingly, the source/drain regions of one pixel may be brought closer to the active layer of an adjacent pixel, by narrowing the width of the deep trench.

Figure 7:
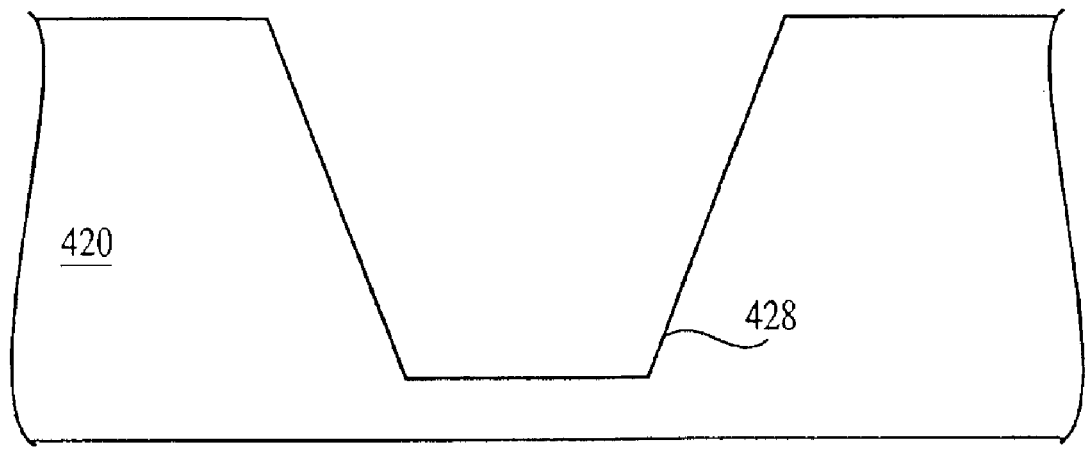
FIG. 7 is a diagrammatic side sectional view of a CMOS image sensor fragment showing a trench in process in accordance with a second embodiment of the present invention.

A second embodiment in accordance with the invention is now described with reference to FIGS. 7–13. Referring now to FIG. 7, a trench 428 is etched into an active layer 420. The trench is preferably a deep trench having a depth greater than about 2500 Angstroms and preferably between about 4000 to about 5000 Angstroms. A resist and mask are applied, and photolithographic techniques are used to define the area to be etched-out. A directional etching process, such as RIE, or etching with a preferential anisotropic etchant is used to etch into the doped active layer 420 to form the trench 428. The resist and mask are removed leaving the FIG. 7 structure.

Figure 8:
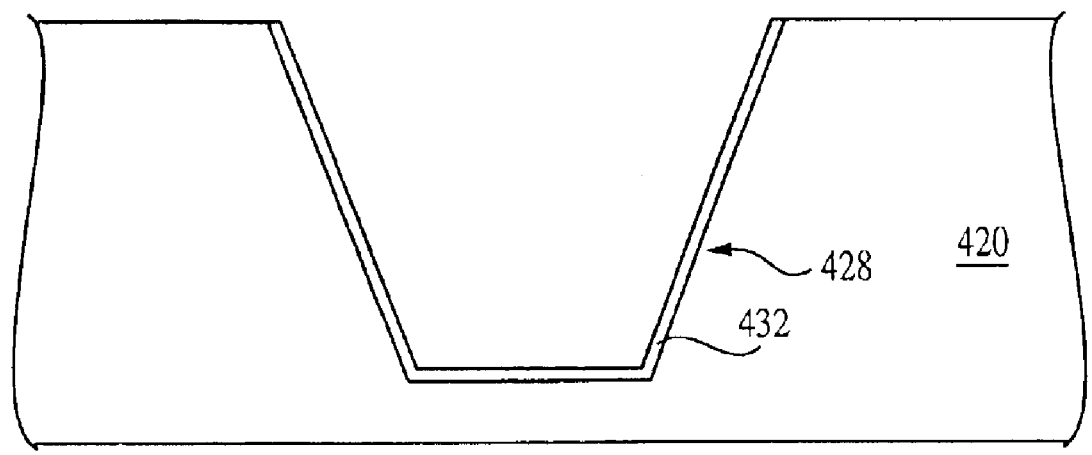
FIG. 8 is a diagrammatic side sectional view of a CMOS image sensor fragment showing a trench at a processing step subsequent to that shown in FIG. 7.

Referring now to FIG. 8, a nitride liner 432 is formed in the trench 428 via Chemical Vapor Deposition (CVD). This nitride liner 432 may be formed of any suitable nitride including NO, ON, ONO, and is preferably formed of silicon nitride.

Figure 9:
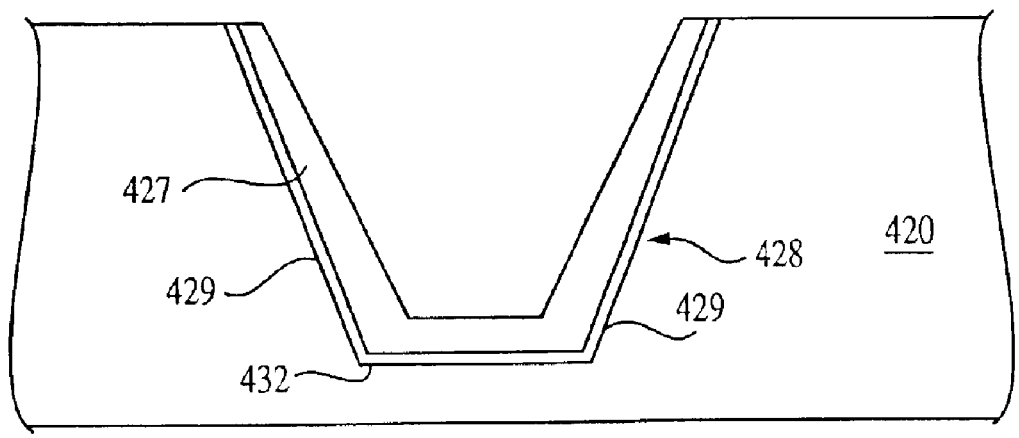
FIG. 9 is a diagrammatic side sectional view of a CMOS image sensor fragment showing a trench at a processing step subsequent to that shown in FIG. 8.

Referring now to FIG. 9, an oxide, e.g. $SiO_2$ or other dielectric liner 427 is formed within the trench 428 and over the silicon nitride liner 432. The liner 427 may be non-conformal, in that its thickness may vary along the trench sidewalls 429. A relatively thick liner can be formed near the bottom of the trench and a thinner liner formed near the top of the trench. Non-conforming materials such as the well-known PSG, BPSG, SOG can be used to produce the liner 427.

Figure 10:
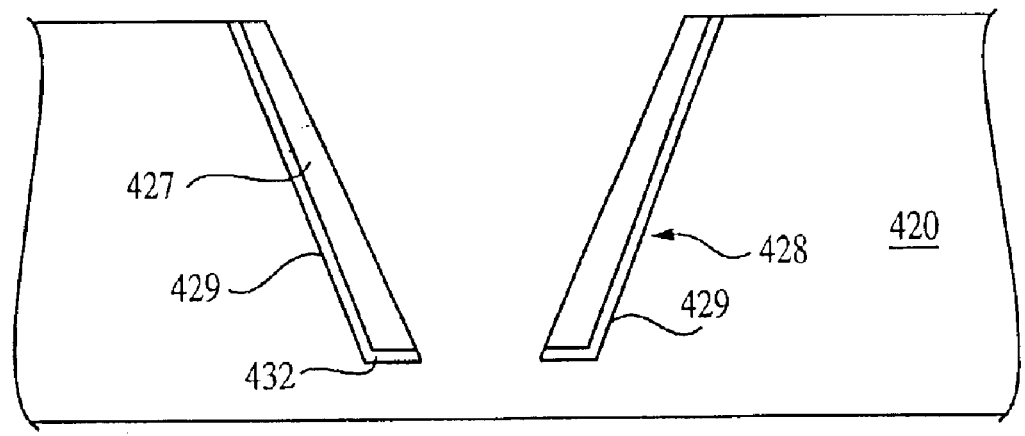
FIG. 10 is a diagrammatic side sectional view of a CMOS image sensor fragment showing a trench at a processing step subsequent to that shown in FIG. 9.

Referring now to FIG. 10, a bottom portion of the oxide liner 427 and nitride liner 432 is stripped away. This can be accomplished by an anisotropic dry etch or a masked wet or dry etch.

Figure 11:
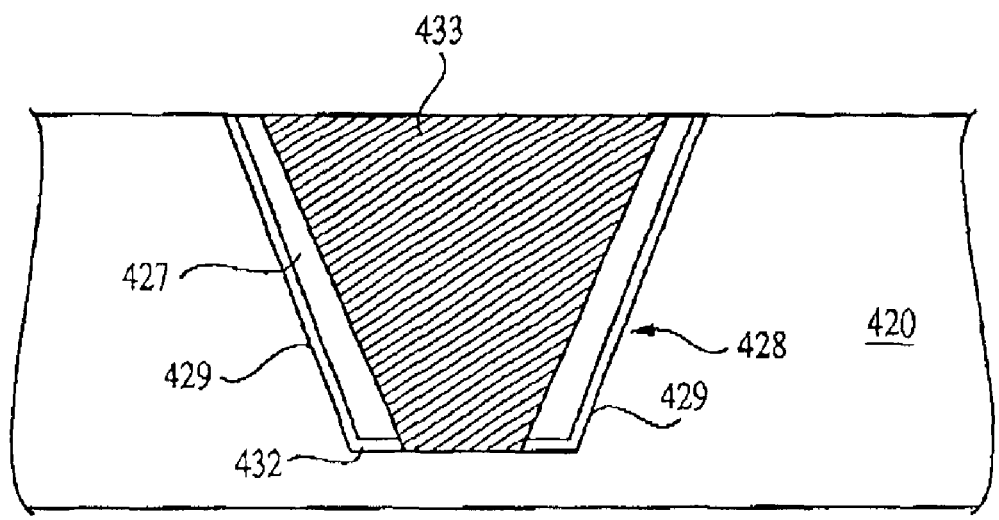
FIG. 11 is a diagrammatic side sectional view of a CMOS image sensor fragment showing a trench at a processing step subsequent to that shown in FIG. 10.

Referring now to FIG. 11, a selective epitaxial layer 433 is grown to fill the trench 428 with silicon. The epitaxial layer 433 may be grown using any suitable technique and may be grown as a single layer or multi-layer. Additionally, the epitaxial layer 433 may be formed such that it is conductive. The epitaxial layer 443 is grown in directly on a surface of the active layer 420 so as to provides a direct electrical contact to the doped active layer 420 through the trench while providing improved field isolation between pixels. Providing a direct electrical contact to the active layer in accordance with the invention, eliminates the need for a top contact, therefore saving space and allowing for tighter pixel formation.

Figure 12:
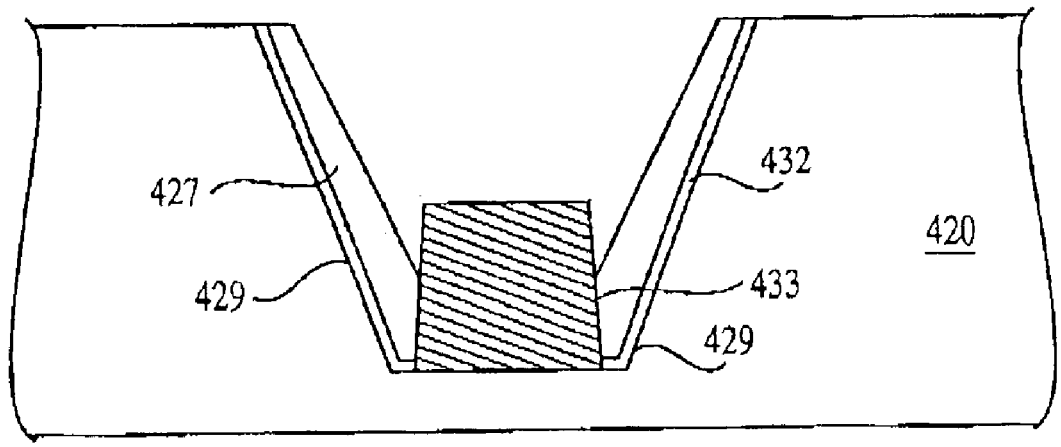
FIG. 12 is a diagrammatic side sectional view of a CMOS image sensor fragment showing a trench in process in accordance with a third embodiment of the present invention at a processing step subsequent to that shown in FIG. 10.

Referring now to FIG. 12, in accordance with yet another embodiment of the invention, the selective epitaxial layer 433 is grown to partially fill the trench 428 with silicon.

Figure 13:
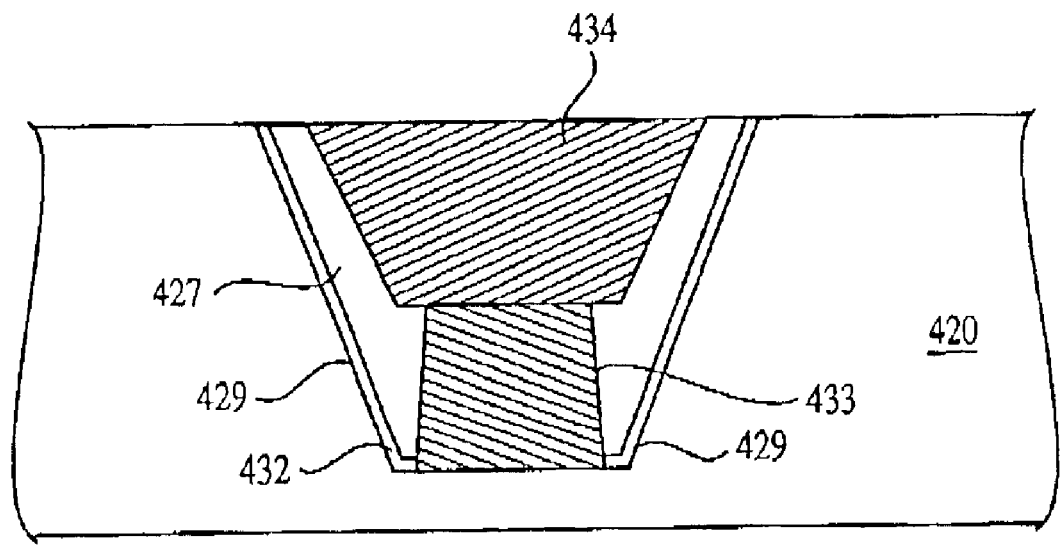
FIG. 13 is a diagrammatic side sectional view of a CMOS image sensor fragment incorporating the trench of FIG. 12.

Referring now to FIG. 13, a deposition process is performed to fill the rest of the trench with a filler material 434. The filler material is preferably an oxide material and is more preferably an HDP oxide. Alternatively, a conductive material containing silicon, for example polysilicon or silicon-germanium, may also be used to fill the rest of the trench 428.

By providing an epitaxial layer 433, the amount of oxide needed to fill the trench is reduced. Accordingly by using a reduced amount of oxide, or not using oxide in situations where conductive material containing silicon is used to fill the rest of the trench or when the trench is filled with the epitaxial layer 433 (as shown in FIG. 11), a deep trench in accordance with the invention may be formed. As discussed above deep trenches provide improved isolation and in the case of CMOS image sensors, prevention of cross-talk between adjacent pixels. And also as discussed above with regard to the first embodiment, the use of a deep trench to provide improved isolation eliminates the need to use excess implants beneath the trench, thereby reducing dark current in CMOS image sensors caused by current leakage. A selective-EPI filled or partially filled trench according to the invention may be used in combination with other aspects of the invention, for example, the selective-EPI-partially filled trench may be used along with a deep trench filled with a conductive material containing silicon.

Figure 14:
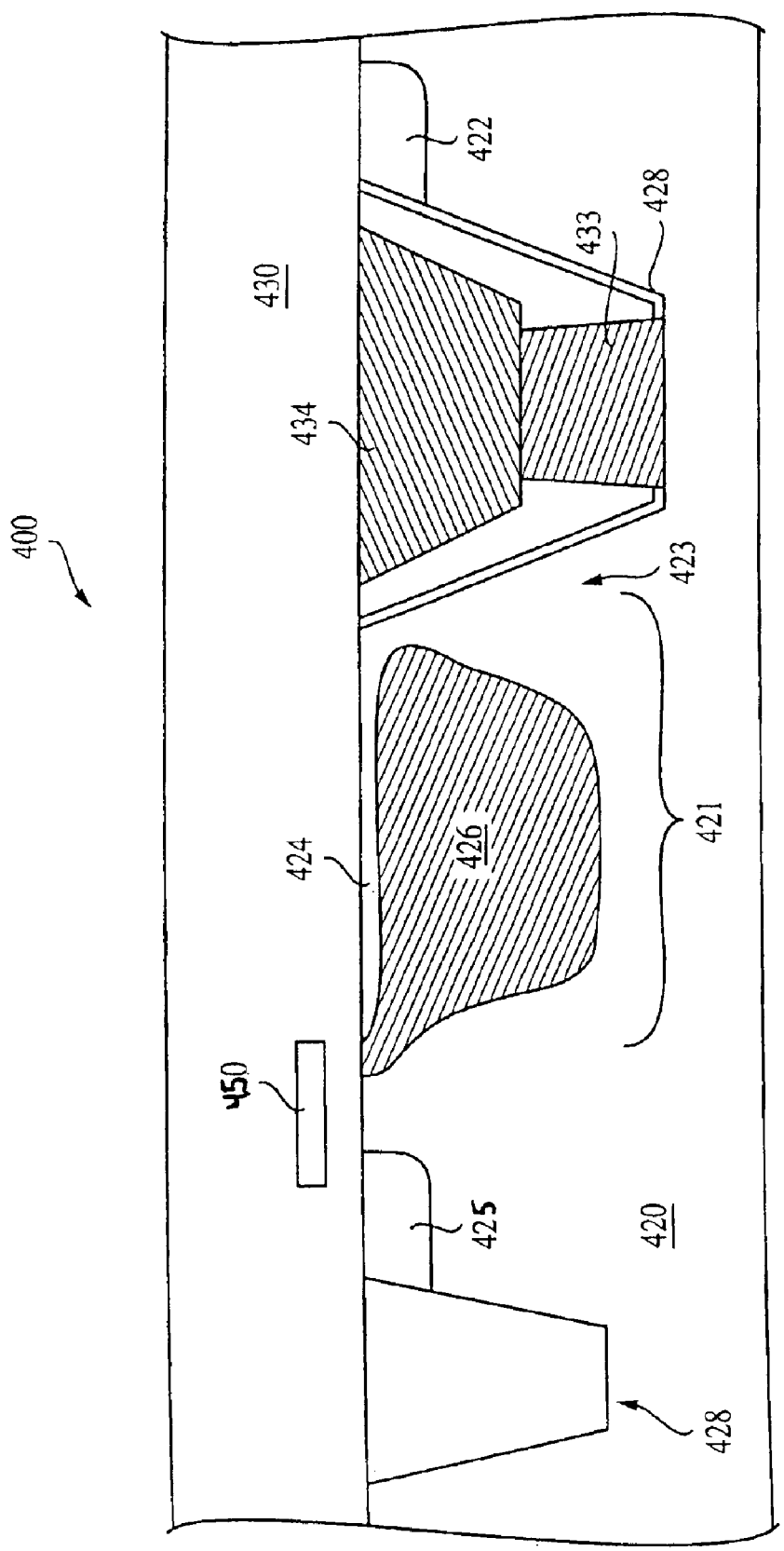
FIG. 14 is a diagrammatic side sectional view of a CMOS image sensor fragment incorporating the trench of FIG. 13.

An exemplary CMOS image sensor in accordance with the invention and having a pinned photodiode 421 is shown in FIG. 14. The pinned photodiode 421 has a p-type surface layer 424 and an n-type photodiode region 426 within a p-type active layer 420. A junction is formed around the entirety of the n-type region 426. An impurity doped floating diffusion region 425, preferably having n-type conductivity, is provided on one side of the channel region of transfer gate 450, the other side of which has a portion of n-type region 426. A trench isolation region 428 is formed in the active layer 420 adjacent to but spaced from n-type region 426. An electrical connection region 423 for providing hole accumulation is formed adjacent the sidewalls of the trench isolation region 428. The trench isolation region 428 is formed as described above with respect to FIGS. 7–13.

The gate stacks, for example transfer gate 450, may be formed before or after the trench is etched. The order of these preliminary process steps may be varied as is required or convenient for a particular process flow, for example, if a photogate sensor which overlaps the transfer gate is desired, the gate stacks must be formed before the photogate, but if a non-overlapping photogate is desired, the gate stacks may be formed after photogate formation.

A translucent or transparent insulating layer 430 is formed over the CMOS image sensor 400. Conventional processing methods are then carried out to form for example, contacts (not shown) in the insulating layer 430 to provide an electrical connection to the source/drain regions, the floating diffusion region 425, and other wiring to connect gate lines and other connections in the sensor 400. For example, the entire surface may then be covered with a passivation layer, of e.g., silicon dioxide, BSG, PSG, or BPSG, which is CMP planarized and etched to provide contact holes, which are then metallized to provide contacts to the photogate (if used), reset gate, and transfer gate.

Pixel arrays according to the invention, and described with reference to FIGS. 2–14, may be further processed as known in the art to arrive at CMOS image sensors having the functions and features of those discussed with reference to FIGS. 2–14.

Figure 15:
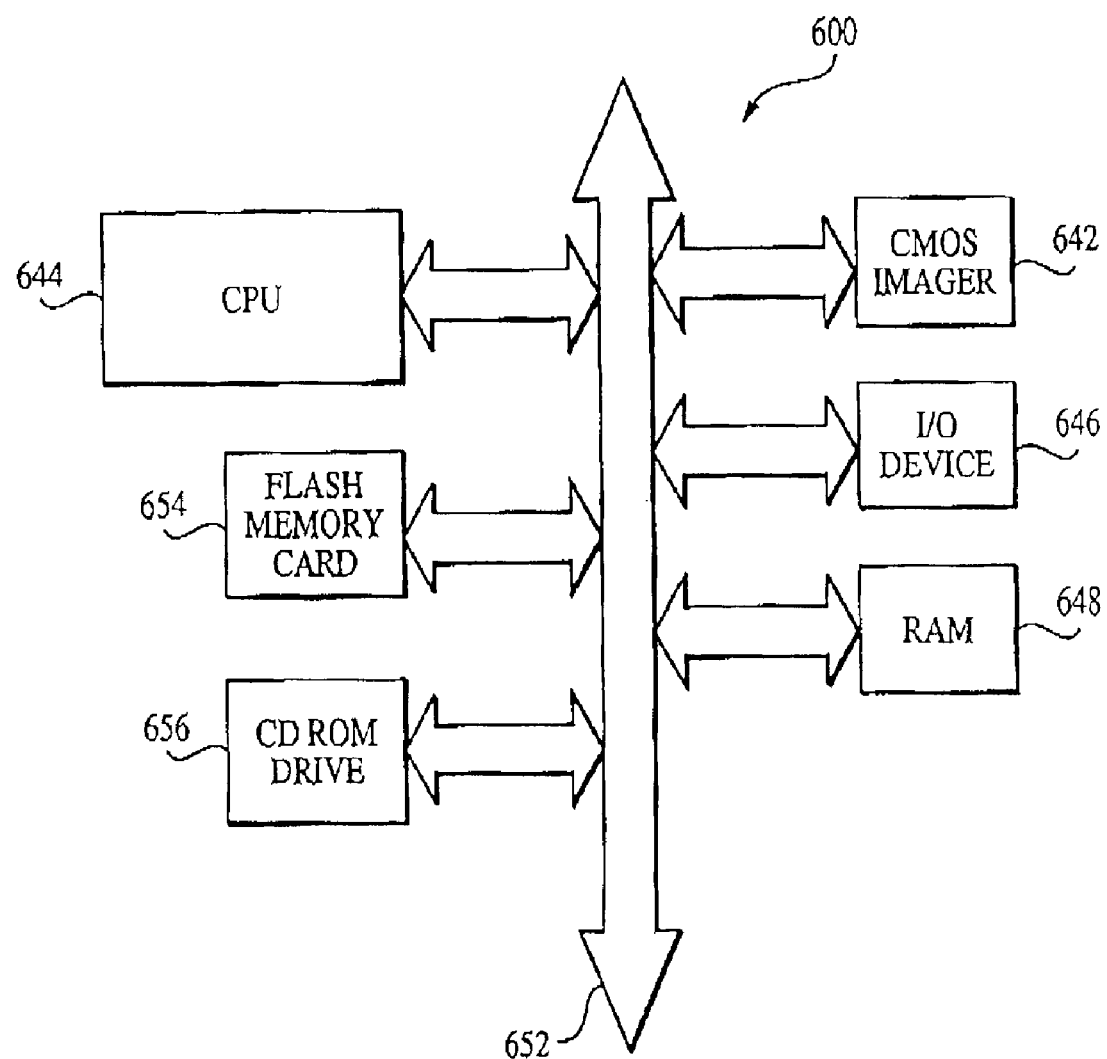
FIG. 15 is a schematic diagram of a processor system incorporating a CMOS image sensor constructed in accordance with the invention.

A typical processor based system, which includes a CMOS image sensor according to the invention is illustrated generally at 642 in FIG. 15. A processor based system is exemplary of a system having digital circuits, which could include CMOS image sensors. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS image sensor 642 also communicates with the system over bus 652. The computer system 600 also includes random access memory (RAM) 648, and, in the case of a computer system may include peripheral devices such as a flash memory card 654, or a compact disk (CD) ROM drive 656 which also communicate with CPU 644 over the bus 652. It may also be desirable to integrate the processor 654, CMOS image sensor 642 and memory 648 on a single IC chip.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A structure for isolating areas in a semiconductor device, said structure comprising:
   a trench formed in a substrate between adjacent regions;
   a nitride liner lining at least one sidewall of said trench;
   an oxide liner over the nitride liner;
   an epitaxial layer in contact with said substrate at a bottom surface of said trench and filling at least a portion of said trench.

2. The structure of claim 1 wherein said trench has a depth of between about 1000 to about 5000 Angstroms.

3. The structure of claim 1 wherein said trench has a depth of greater than about 2000 Angstroms.

4. The structure of claim 1 wherein said semiconductor device comprises a CMOS image sensor.

5. The structure of claim 1 wherein said epitaxial layer is conductive.

6. The system of claim 5 wherein said conductive material has an n-type conductivity.

7. The system of claim 5 wherein said conductive material has a p-type conductivity.

8. The system of claim 5 wherein said conductive material comprises silicon.

9. The system of claim 8 further comprising polysilicon filling said trench.

10. The system of claim 8 further comprising silicon-germanium filling said trench.

11. A structure for isolating areas in an image sensor, said structure comprising:
    a trench formed in an image sensor substrate between adjacent pixels;
    an insulating liner formed along at least one wall of said trench;
    an epitaxial layer in contact with said substrate at a bottom surface of said trench; and
    a filler material deposited over said epitaxial layer and within said trench, wherein said filler material comprises a conductive material.

12. The structure of claim 11 wherein said insulating liner comprises an oxide material.

13. The structure of claim 12 wherein said insulating liner comprises NO.

14. The structure of claim 12 wherein said insulating liner comprises ON.

15. The structure of claim 12 wherein said insulating liner comprises ONO.

16. The structure of claim 11 wherein said insulating liner is non-conformal.

17. The structure of claim 11 further comprising a nitride liner formed between said at least one sidewall of said trench and said insulating liner.

18. The structure of claim 17 wherein said nitride liner comprises silicon nitride.

19. The structure of claim 17 wherein said nitride liner comprises NO.

20. The structure of claim 17 wherein said nitride liner comprises ON.

21. The structure of claim 17 wherein said nitride liner comprises ONO.

22. The structure of claim 11 wherein said filler material comprises silicon.

23. The structure of claim 22 wherein said filler material comprises polysilicon.

24. The structure of claim 22 wherein said filler material comprises silicon-germanium.

25. A processing system comprising: (i) a processor; and (ii) a semiconductor device coupled to said processor and including:

a trench formed in a substrate between adjacent regions;

a nitride liner lining at least one sidewall of said trench;

an oxide liner over the nitride liner; and an epitaxial layer in contact with said substrate at a bottom surface of said trench and filling at least a portion of said trench.

26. The system of claim 25 wherein said trench has a depth of between about 1000 to about 5000 Angstroms.

27. The system of claim 25 wherein said trench has a depth of greater than about 2000 Angstroms.

28. The system of claim 25 wherein said oxide layer is non-conformal.

29. The system of claim 25 wherein said nitride layer is between said at least one sidewall of said trench and said oxide layer.

30. The system of claim 25 further comprising a filler material deposited over said epitaxial layer and within said trench.

31. The system of claim 30 wherein said filler material comprises an insulating material.

32. The system of claim 31 wherein said insulating material comprises an oxide.

33. The structure of claim 32 wherein said insulating material comprises an HDP oxide.

34. The system of claim 25 wherein said epitaxial layer provides a direct electrical contact to an active layer of said substrate.

35. The system of claim 30 wherein said filler material is a conductive material.

36. The system of claim 25 wherein said epitaxial layer is conductive.

37. The structure of claim 1 further comprising a first conductive material within said trench.

38. The structure of claim 37 wherein said first conductive material has an n-type conductivity.

39. The structure of claim 37 wherein said first conductive material has a p-type conductivity.

40. The structure of claim 37 wherein said first conductive material comprises silicon.

41. The structure of claim 40 further comprising silicon-germanium filling said trench.

42. The structure of claim 40 further comprising polysilicon filling said trench.

* * * * *